United States Patent
Rabkin et al.

(10) Patent No.: US 6,849,489 B2
(45) Date of Patent: Feb. 1, 2005

(54) METHOD FOR FORMING TRANSISTORS WITH ULTRA-SHORT GATE FEATURE

(75) Inventors: Peter Rabkin, Cupertino, CA (US); Hsingya Arthur Wang, San Jose, CA (US); Kai-Cheng Chou, San Jose, CA (US)

(73) Assignee: Hynix Semiconductor, Inc., Kyoungki-do (KR)

( * ) Notice: Subject to any disclaimer, the term of this patent is extended or adjusted under 35 U.S.C. 154(b) by 0 days.

(21) Appl. No.: 10/861,116

(22) Filed: Jun. 3, 2004

(65) Prior Publication Data

US 2004/0219755 A1 Nov. 4, 2004

Related U.S. Application Data

(62) Division of application No. 09/808,097, filed on Mar. 13, 2001, now Pat. No. 6,746,906, which is a division of application No. 09/797,863, filed on Mar. 1, 2001.

(51) Int. Cl.[7] .......................................... H01L 21/8238
(52) U.S. Cl. ...................... 438/199; 438/230; 438/303; 438/514
(58) Field of Search ................................ 438/199, 230, 438/303, 514, 527

(56) References Cited

U.S. PATENT DOCUMENTS

| | | | |
|---|---|---|---|
| 4,939,558 A | 7/1990 | Smayling et al. | |
| 5,716,861 A | 2/1998 | Moslehi | |
| 5,780,891 A | 7/1998 | Kauffman et al. | |
| 5,793,089 A | 8/1998 | Fulford, Jr. et al. | |
| 5,918,125 A | 6/1999 | Guo et al. | |
| 5,920,783 A | * 7/1999 | Tseng et al. | 438/305 |
| 6,143,606 A | 11/2000 | Wang et al. | |
| 6,187,619 B1 | 2/2001 | Wu | |
| 6,330,187 B1 | 12/2001 | Choi et al. | |
| 6,346,725 B1 | 2/2002 | Ma et al. | |
| 6,350,665 B1 | 2/2002 | Jin et al. | |
| 6,512,273 B1 | 1/2003 | Krivokapic et al. | |

* cited by examiner

Primary Examiner—David S. Blum
(74) Attorney, Agent, or Firm—Townsend and Townsend and Crew LLP

(57) ABSTRACT

A gate electrode is formed over but is insulated from a semiconductor body region for each of first and second transistors. Off-set spacers are formed along side-walls of the gate electrode of each of the first and second transistors. After forming the off-set spacers, a DDD implant is performed to form DDD source and DDD drain regions in the body region for the first transistor. After the DDD implant, main spacers are formed adjacent the off-set spacers of at least the first transistor. A LDD implant is performed to form LDD source and LDD drain regions for the second transistor. After forming the main spacers, a source/drain (S/D) implant is carried out to form a highly doped region within each of the DDD drain and DDD source regions and each of the LDD drain and LDD source regions.

2 Claims, 6 Drawing Sheets

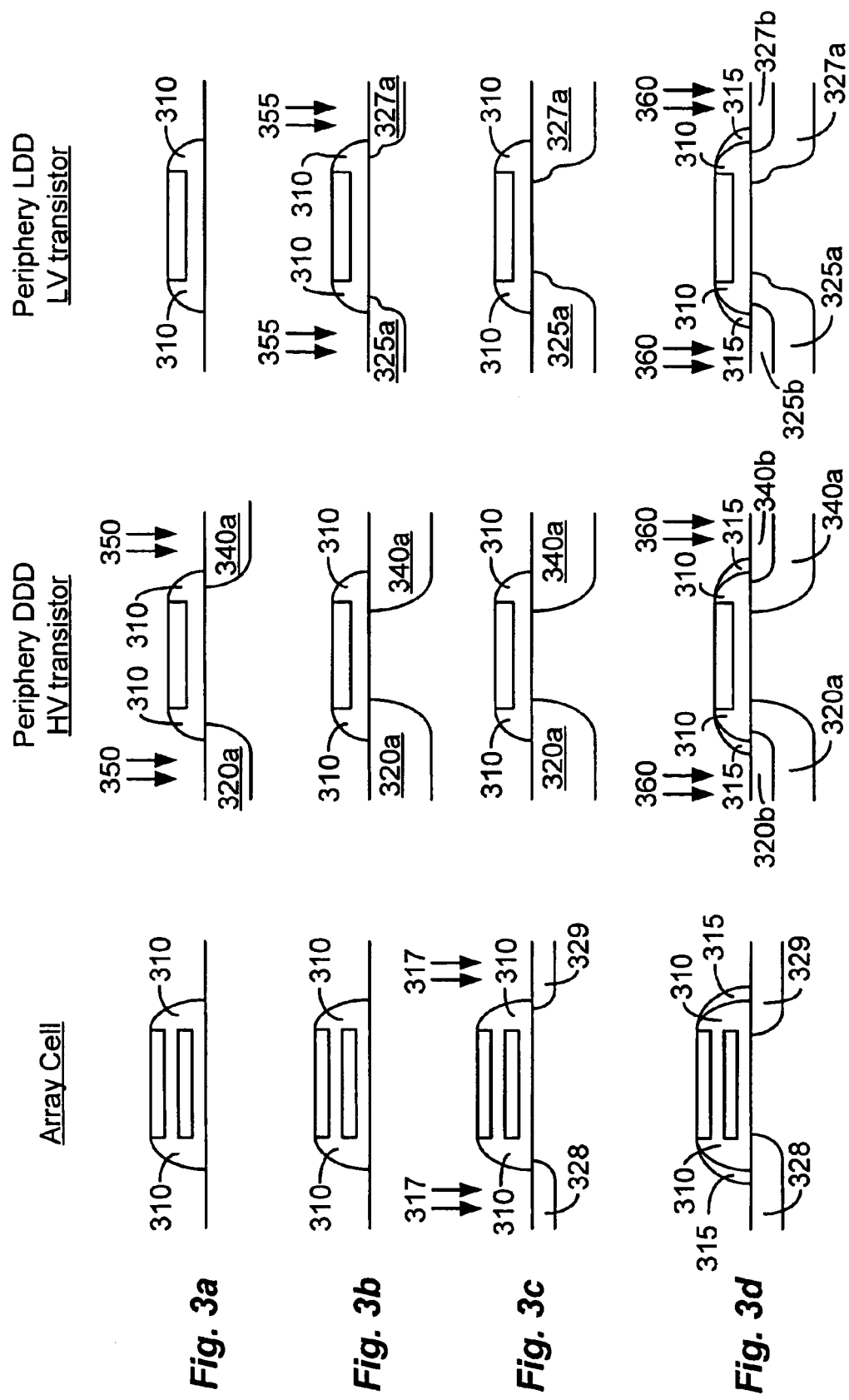

METHOD FOR FORMING TRANSISTORS WITH ULTRA-SHORT GATE FEATURE

CROSS-REFERENCES TO RELATED APPLICATIONS

This is a Division of U.S. application Ser. No. 09/808,097, filed Mar. 13, 2001, now U.S. Pat. No. 6,746,906 which is a Division of U.S. application Ser. No. 09/797,863, filed Mar. 1, 2001, the disclosures of which are incorporated herein by reference.

BACKGROUND OF THE INVENTION

Technology scaling has been a main driving force behind the rapid advancement of the semiconductor industry. As part of the scaling efforts, state of the art processes for manufacturing smaller and higher performance transistors are continuously under development. For example, it is desirable to reduce the channel length of a transistor in order to increase the current capability of the transistor and to make the overall transistor size smaller. However, in scaling down the channel length, such barriers as junction breakdown and transistor punch through must first be overcome. Junction breakdown occurs when the electric field across a reverse biased junction becomes high enough to initiate avalanche impact ionization generation, resulting in a sharp current increase. In MOS technology, the junction breakdown voltage can be improved by reducing channel doping concentration and/or using lightly doped drain (LDD) and double doped drain (DDD) junctions.

Transistor punch through is defined as the drain voltage at which the drain depletion region extends all the way to that of the source region so that the source and drain regions become electrically shorted together. The transistor thus draws an undesirably high amount of current, resulting in prohibitively high leakage current or even the destruction of the transistor. The shorter the channel length is made, the lower is the drain voltage at which the drain to source punch through occurs. This can severely limit the operational voltages of integrated circuits. In order to improve punch-through effects, the channel doping concentration may be increased; however, this in turn leads to a lower junction breakdown voltage.

One of the factors influencing the extent to which the drawn gate feature or gate line width can be scaled is the amount of the gate overlap with the source/drain (S/D) regions that a process can tolerate. Clearly, the smaller the overlap, the smaller can the gate feature be made. Achieving a small overlap is a difficult task because of the inherent side diffusion of the source and drain regions during S/D implant activation and anneal.

This limitation on scaling of MOS transistors is even more pronounced in scaling of non-volatile memory cells. This is because such features of the non-volatile memory cell as the floating gate tunnel oxide and the interpoly dielectric layer (e.g., oxide-nitride-oxide (ONO) multilayer) are not readily scalable due to quality considerations of these insulating materials and the cell charge retention constraints.

As an example, a simplified conventional process sequence for a stack gate flash memory cell includes: forming a tunnel oxide over a substrate; forming a floating gate (poly 1) over the tunnel oxide; forming an interpoly ONO dielectric composite layer; and forming a control gate (poly 2 and tungsten silicide) over the ONO dielectric. In modern technologies, the control gate is often formed simultaneously with the gates of peripheral (CMOS) transistors, followed by cell self-aligned etch (SAE) of poly 1 using poly 2 as a mask. After formation of the polysilicon stack, a re-oxidation thermal cycle is performed. In subsequent steps, DDD implanting steps are performed for periphery high voltage (HV) NMOS and PMOS transistors, followed by oxidation and anneal cycles.

Next, the cell S/D implant (in case of symmetrical S/D cells) is performed followed by forming oxide spacers along the side-walls of both the cell polysilicon stack the periphery transistor gates. The properties and physical characteristics of the source and drain regions are dependent on the thickness of the screen oxide (i.e., oxide previously deposited covering the substrate surface areas where the source and drain regions are formed) through which the S/D implant is performed, the implant dose and energy, and the thermal activation. The room for optimizing the source and drain regions is limited. The S/D implant dose has to be sufficiently high to ensure low source and drain resistance, and the implant energy needs to be optimized based on the screen oxide thickness and the junction vertical depth requirements. The above parameters along with the thermal budget of S/D activation/anneal determine the extent of the overlap between the poly stack and the S/D regions, and thus the minimum effective channel length.

As indicated earlier, scaling of the thickness of the tunnel oxide and ONO dielectric layers are substantially limited. To reduce the gate length without scaling down the tunnel oxide and the ONO dielectric layers requires formation of sufficiently deep S/D junctions (e.g., junction depth of 0.07–0.1 $\mu$m for gate length of 0.15–0.20 $\mu$m) to ensure proper functioning of the cell. Sufficient junction depth is needed for lowering source/drain resistance, and achieving the desired overlap with the gate. The gate overlap should be sufficient for proper programming, read efficiency, and reliability considerations, yet small enough to provide for sufficient effective channel length, especially for very short gate feature. As such, the lateral junction depth, and thus the overlap between the polysilicon stack and the S/D regions are predetermined and limited by the S/D implant and thermal activation requirements.

For drawn gate length of 0.2 $\mu$m, and maybe even 0.15 $\mu$m, the effective channel length (which equals the drawn gate length minus the overlaps between the gate and the S/D regions) may be sufficient for proper functioning of the cell (i.e., without punch-through and with high enough junction breakdown voltage BVdss), provided the channel doping is properly optimized. However, for gate length of about 0.12 $\mu$m and shorter, the effective channel length becomes too short, or practically disappears. The cell will exhibit punch-through at very low drain voltage, preventing the cell from proper functioning.

Even highly advanced flash technologies with memory cell gate length of 0.1 $\mu$m or shorter, require a drain voltage of 3–5V to ensure sufficient programming speed by channel hot electron injection. However, for such small gate features and voltage requirements, the above-mentioned adverse short channel effects can not be properly addressed only by optimizing the source/drain implant conditions and channel doping.

SUMMARY OF THE INVENTION

In accordance with the present invention, an off-set spacer is introduced in the process steps for manufacturing memory cells and transistors and the resulting structures which enables dramatic scaling of the channel length such that high performance transistors and memory cell structures with extremely small gate feature and overall size that exhibit robust program/erase efficiency and read speed, and enable low operating voltages, can be manufactured.

In one embodiment, semiconductor transistors are formed as follows. A gate electrode is formed over but is insulated from a semiconductor body region for each of first and second transistors. Off-set spacers are formed along sidewalls of the gate electrode of each of the first and second transistors. After forming the off-set spacers, a DDD implant is carried out to form DDD source and DDD drain regions in the body region for the first transistor. After the DDD implant, main spacers are formed adjacent the off-set spacers of at least the first transistor. A LDD implant is performed to form LDD source and LDD drain regions for the second transistor. After forming the main spacers, a source/drain (S/D) implant is carried out to form a highly doped region within each of the DDD drain and DDD source regions and each of the LDD drain and LDD source regions. The highly doped regions are of the same conductivity type as and have a doping concentration greater than the DDD and LDD regions.

In another embodiment, the extent of an overlap between the gate electrode of the first transistor and each of the DDD source and DDD drain regions is inversely dependent on a thickness of the off-set spacers, and a distance between an outer edge of each of the DDD source and DDD drain regions and an outer edge of the corresponding highly doped region within each of the DDD source and DDD drain regions is directly dependent on a thickness of the main spacers.

The following detailed description and the accompanying drawings provide a better understanding of the nature and advantages of the present invention.

BRIEF DESCRIPTION OF THE DRAWINGS

FIGS. 3a–3d show cross section views of a memory cell, a low voltage periphery LDD transistor, and a high voltage periphery DDD transistor at different processing steps in accordance with an exemplary embodiment of the present invention;

DESCRIPTION OF THE SPECIFIC EMBODIMENTS

In accordance with the invention, MOS transistors and non-volatile memory cells with ultra-short gate length, e.g., 0.12 $\mu$m and shorter, with improved punch-through and junction breakdown characteristics, and methods of fabricating the same are obtained. A new element, called the off-set spacer, is introduced in the fabrication process and the resulting structures. The off-set spacer serves as an additional means for process and device optimization, and controlling the effective channel length. The off-set spacer can be used in MOS transistor to reduce the extent of overlap between the gate and the source/drain (S/D) regions, so that the effective channel length is sufficiently increased even for extremely small geometry of the gate. Further, the off-set spacer allows deeper S/D junctions to be formed for the same channel length, and thereby reduces source/drain resistance while controlling precisely gate overlap. The off-set spacer can be similarly used in memory cells to reduce the extent of overlap between the floating gate or the select gate and the S/D regions, and to form deeper junctions.

Thus, MOS transistors and non-volatile memory cells with extremely small gate feature size, which exhibit high program/erase efficiency and read speed, and enable use of low operating voltages, while eliminating the punch-through problem associated with ultra-short channel length devices, is obtained. Other features and advantages of the present invention will become apparent from the following description.

Figure 1A:
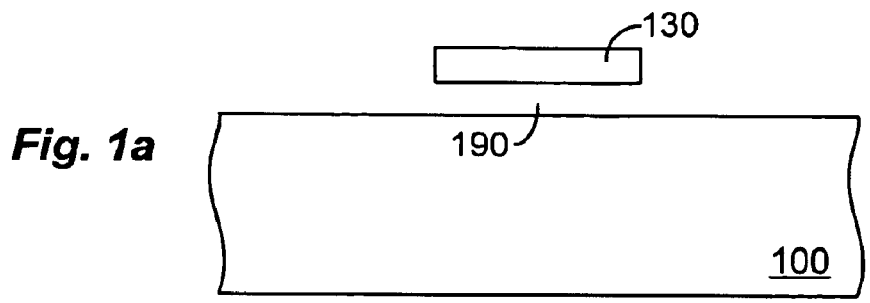
FIGS. 1a–1g show cross section views of a MOS transistor at different processing steps in accordance with an exemplary embodiment of the present invention.
Figure 1B:
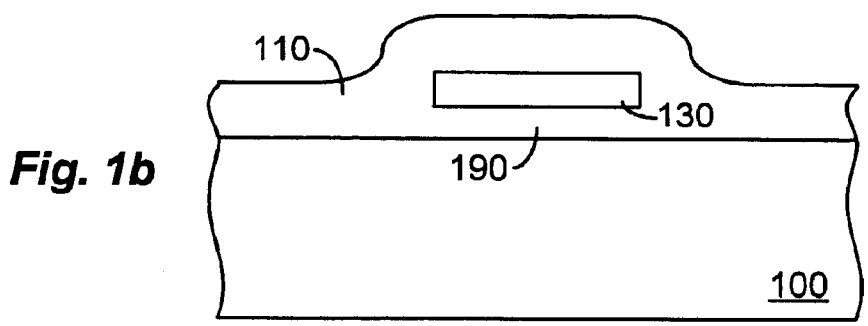
Figure 1C:
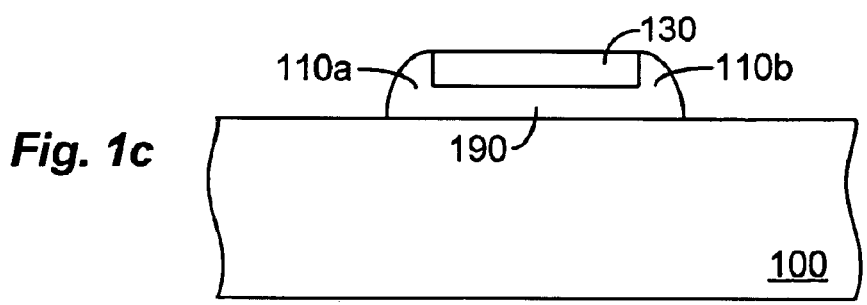

FIGS. 1a–1f show cross section views of a MOS transistor at different processing steps in accordance with an exemplary embodiment of the present invention. FIG. 1a shows a polysilicon gate 130 formed over but insulated from a body region 100 according to conventional processing steps. Next, an off-set oxide spacer layer 110 is deposited over the structure using conventional chemical vapor deposition (CVD) techniques, as shown in FIG. 1b. Oxide layer 110 is then etched using conventional reactive ion etching (REI) techniques, to form off-set oxide spacers 110a and 110b along the side-walls of gate 130, as shown in FIG. 1c.

Figure 1D:
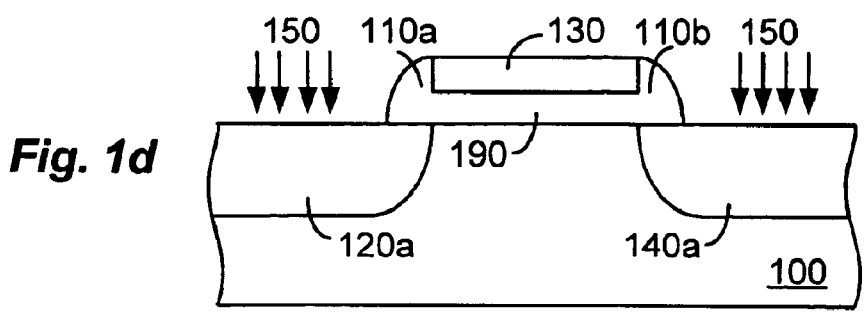

In FIG. 1d, an implant step is carried out to form junction regions 120a and 140a. In one embodiment, implant 150 is a conventional source/drain (S/D) implant. In conventional processes, S/D implant 150 is carried out before forming oxide spacers. However, by performing the S/D implant 150 after forming off-set spacers 10a, 10b, the drain/source to gate overlap is reduced, thus increasing the effective channel length for the same drawn gate feature. The thickness of the off-set spacer can be optimized based on device requirements and the desired lateral drain/source to gate overlap. By using N-type impurities for implant 150, a NMOS transistor is formed, and by using P-type impurities for implant 150, a PMOS transistor is formed. Conventional masking steps are carried out to protect the PMOS regions during N-type implant, and vice versa.

Figure 1E:
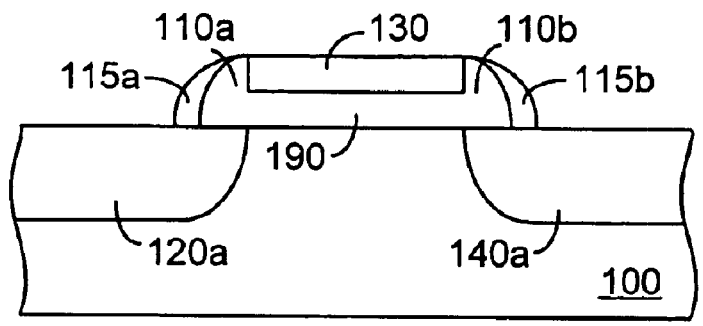
Figure 1F:
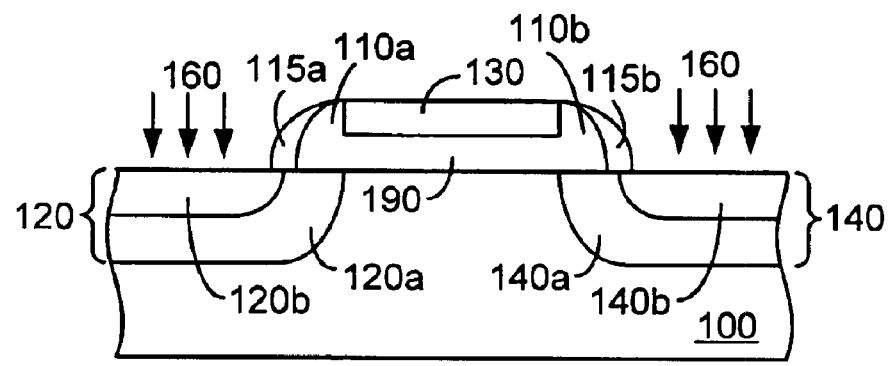

In an alternate embodiment, implant 150 is a double doped drain (DDD) implant to form DDD source and drain junctions for high voltage transistors. In this embodiment, as shown in FIG. 1e, a main spacer oxide layer is deposited and etched to form main spacers 115a, 115b. A S/D implant 160 is then carried out to form regions 120b and 140b as shown in FIG. 1f. In this embodiment, N$^-$ impurities is used as implant 150, and N$^+$ impurities is used as implant 160, to form a high voltage NMOS transistor. By implementing the proper masking steps, high voltage PMOS transistors are formed by using P$^-$ impurities as implant 150 and P$^+$ impurities as implant 160.

Figure 1G:
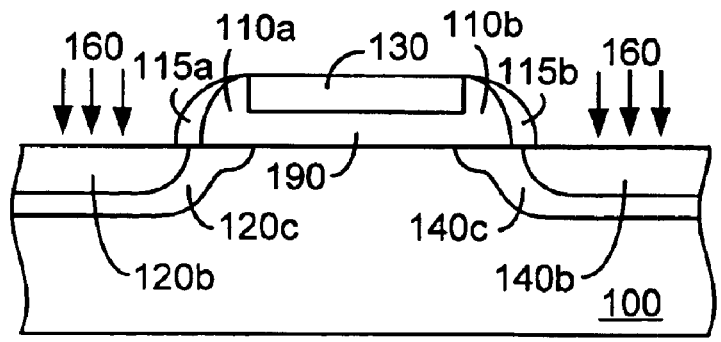

In yet another embodiment, implant 150 (FIG. 1d) is a lightly doped drain (LDD) implant to form LDD source 120c and LDD drain 140c regions as shown in FIG. 1g.

In another embodiment, off-set spacers are formed, and then DDD junctions for high voltage (HV) transistors are formed followed by forming LDD junctions for low voltage (LV) transistors. Main oxide spacers are then formed followed by S/D implant. Forming the main oxide spacers is optional and may or may not be employed for LV and/or HV MOS transistors depending on device requirements. However, the off-set spacer and main spacer can be advantageously combined. The off-set spacer can be used to obtain a longer effective channel length for the same drawn gate length in order to improve source/drain punch-through, while the main spacer can be used to improve the junction breakdown by providing a wider separation between the outer edges of each of the LDD and DDD regions and the outer edges of their respective inner regions formed by the S/D implant. For example, in FIG. 1f, if off-set spacers 110a, 110b need to be made thin, then the main oxide spacers can be used to ensure that the outer edge of each of the junction regions 120b and 140b are farther from the edges of the corresponding junction regions 120a and 140a, thus improving the junction breakdown.

Other process sequence permutations can be envisioned by one skilled in the art in view of the above description. For example, in a first permutation, off-set spacers are formed before the DDD implant, main spacers are formed between the DDD implant and the subsequent LDD implant, and the S/D implant is performed after the LDD implant. Using FIGS. 1f and 1g, in the resulting DDD and LDD transistor structures, the extent of an overlap between the gate 130 and each of the DDD source 120a and DDD drain 140a regions is dependent on the thickness of the off-set spacers 110a, 10b, and the extent of an overlap between the gate 130 and each of the LDD source 120c and LDD drain 140c regions is dependent on the combined thickness of the off-set 110 and main 115 spacers or to the thickness of only the off-set spacers if main spacers are not formed for the LDD transistor. Also, a distance between an outer edge of each of the DDD source 120a and DDD drain 140a regions and an outer edge of their corresponding inner regions 120b, 140b is directly dependent (i.e., not inversely) on the thickness of the main spacers.

In a second exemplary permutation, off-set spacers are formed before DDD and LDD implant steps, and main spacers are formed after the DDD and LDD implant steps but before the subsequent S/D implant. Using FIGS. 1f and 1g, in the resulting DDD and LDD transistor structures, the extent of an overlap between the gate 130 and each of the DDD source 120a and DDD drain 140a regions, and the extent of an overlap between the gate 130 and each of the LDD source 120c and LDD drain 140c regions is inversely dependent on the thickness of the off-set spacers 110a, 110b. Also, a distance between an outer edge of each of the DDD source 120a and DDD drain 140a regions and an outer edge of their corresponding inner regions 120b, 140b is directly dependent on the thickness of the main spacers 115a, 115b, and a distance between an outer edge of each of the LDD source 120c and LDD drain 140c regions and an outer edge of their corresponding inner regions 120b, 140b is directly dependent on the thickness of the main spacers.

In a third exemplary permutation, off-set spacers are formed between the DDD implant and the subsequent LDD implant, and main spacers are formed between the LDD implant and the subsequent S/D implant. Using FIGS. 1f and 1g, in the resulting DDD and LDD transistor structures, the extent of an overlap between the gate 130 and each of the LDD source 120c and LDD drain 140c regions is inversely dependent on a thickness of the off-set spacers 110a, 10b, and a distance between an outer edge of each of the DDD source 120a and DDD drain 140a regions and an outer edge of their corresponding inner regions 120b, 140b is directly dependent on the combined thickness of the off-set 110 and main 115 spacers or to the thickness of only the off-set spacer if main spacers are not formed for the DDD transistor. Also, a distance between an outer edge of each of the LDD source 120c and LDD drain 140c regions and an outer edge of their corresponding inner regions 120b, 140b is directly dependent on the thickness of the main spacers.

Conventional anneal and oxidation cycles are carried out in each of the above embodiments as is well known in this art. Each of the source 120 and drain 140 regions has an overlap with gate 130, the extent of which is dependent on the thickness of the off-set spacers 110a, 110b. If a thinner off-set oxide layer 110 (FIG. 1b) is deposited, a larger overlap is obtained, while a thicker off-set oxide layer will result in a smaller overlap. For many of the present process technologies, the range of the thickness of the off-set oxide layer may be 100–500 Å depending on device channel length and its overall optimization. The off-set spacer thickness may be reduced to 20–50 Å as technology scaling moves to next generation processes.

To illustrate the process steps for a non-volatile memory cell, a flash technology that utilizes the advanced channel erase method with symmetrical source and drain regions is used. In contrast to the source-side erase (including negative gate erase) approaches, the channel erase approach does not require the relatively deep DDD source junction, thus allowing for better scaling of the cell. Also, the source and drain regions can be symmetrical and formed by just one S/D implant. However, the invention is not limited to memory cell structures using channel erase, and can be advantageously applied to other non-volatile memory cells including cell structures using source-side erase.

Figure 2A:
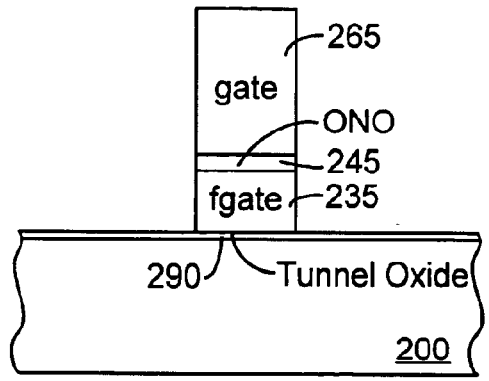
FIGS. 2a–2d show cross section views of a channel erase non-volatile memory cell at different processing steps in accordance with an exemplary embodiment of the present invention.

FIGS. 2a–2d show cross section views of a non-volatile memory cell at different processing steps in accordance with an exemplary embodiment of the present invention. FIG. 2a shows a polysilicon stack formed according to conventional techniques. A tunnel oxide layer 290 overlays a silicon substrate 200; floating gate 235 overlays tunnel oxide 290; a composite ONO dielectric layer 245 overlays floating gate 235; and control gate 265 overlays the ONO dielectric 245.

Figure 2B:
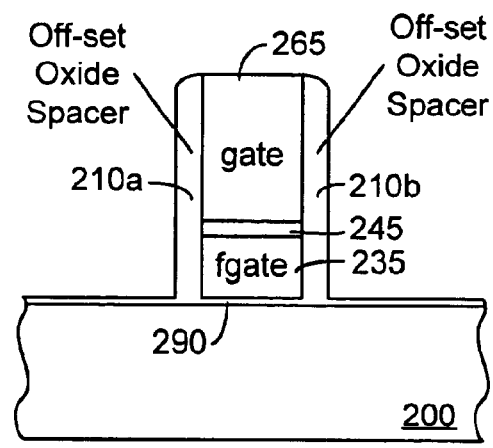

An off-set oxide deposition and etch are carried out to form off-set oxide spacers 210a, 210b along the polysilicon stack side-walls as shown in FIG. 2b. In one embodiment, conventional CVD techniques are used to deposit the off-set oxide layer over the structure, and then conventional reactive ion etching (REI) techniques are used to etch the off-set oxide layer. The thickness of the off-set oxide layer is selected based on the drawn gate length and the desired channel length, and process specifics. The thickness of the off-set spacers may be in the range of, for example, 20–500 Å. For the example shown in FIGS. 2a–2d, the drawn gate length is 0.1 µm, and the off-set spacer thickness is around 250 Å. Modern processes can provide spacer thickness as thin as 20–30 Å with 8–10% film thickness variations.

Figure 2C:
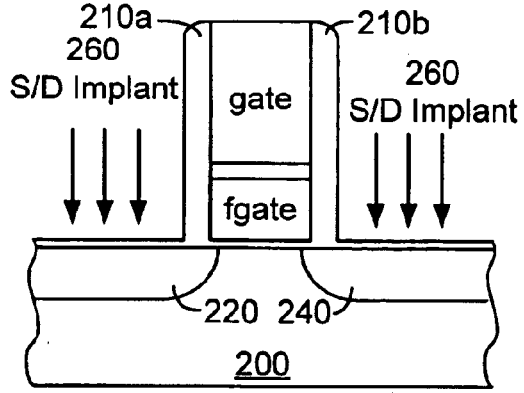
Figure 2D:
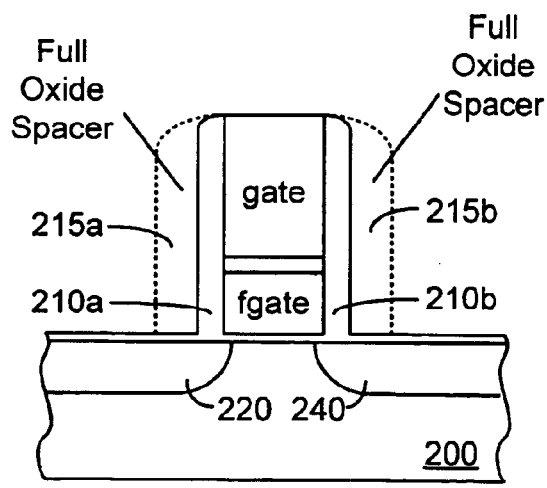

As shown in FIG. 2c, a S/D implant 260 is performed next to form source 220 and drain 240 regions in accordance with conventional techniques. $N^+$ impurities may be used to from a N-type cell, and $P^+$ impurities may be used to form a P-type cell. Next, a main oxide spacer layer is deposited and etched to from main oxide spacers 215a, 215b adjacent the off-set spacers 210a, 210b, as shown in FIG. 2d. The implanted S/D regions 220, 240 are then subjected to a thermal activation cycle. Main oxide spacers 215a, 215b are not necessary, and are included in the cell to eliminate a masking layer which would otherwise be needed to protect the array region during the formation of main oxide spacers in low voltage (LV) LDD and high voltage (HV) DDD peripheral transistors. This is discussed in more detail below where integration of a flash cell process with a CMOS process is described.

The presence of the off-set spacers 210a, 210b reduces the overlap between the floating gate and the source/drain junctions by approximately the off-set spacer width, thus resulting in a longer effective channel length for the small gate feature of 0.1 µm. In the FIG. 2 example, with an oxide spacer thickness of about 250 Å and drawn gate length of 0.1 µm, an effective channel length of about 0.06 µm is obtained. Simulation results indicate that with proper optimization of the channel doping profile (e.g., boron Vt implant in the range of $4.5 \times 10^{13}$ to $5.5 \times 10^{13}/cm^2$, S/D implant in the range of $3 \times 10^{15}$ to $4 \times 10^{15}$ at 20–25 keV, a tunnel oxide in the range of 80–90 Å, and ONO thickness in the range of 110–140 Å) the cell does not exhibit punch-through, with a BVdss of 4.4–4.5V. This level of BVdss allows drain programming voltage of 3.5–4.0V, which ensures high programming efficiency.

Also, since the off-set spacer regulates the source/drain to gate overlap and consequently the channel length, the S/D implant and thermal activation conditions can now be optimized independently. This provides an added flexibility in obtaining the required junction vertical depth and the desired source/drain resistance.

In another embodiment, after depositing an off-set oxide layer, the spacer off-set oxide etch step is delayed or completely excluded, so that the subsequent S/D implant is carried out through the deposited off-set oxide layer. In this embodiment, to obtain the proper junction characteristics, the S/D implant energy and dose need to be properly adjusted based on the combined thickness of the off-set spacer and the screening (residual) oxide present from prior processing steps.

The off-set spacer may also be advantageously used in manufacturing other types of non-volatile memory cells. For example, in the case of source-side erase, or negative gate erase, wherein the source and drain junctions are asymmetrical, the off-set spacers can be used to improve the band-to-band tunneling and the junction breakdown problems commonly encountered at the source side. The band-to-band tunneling can adversely impact the cell endurance and charge retention. In such cells, the source region is typically a DDD junction while the drain region has ordinary characteristics. Because the source region is a DDD junction, the junction tends to be deep with relatively large side diffusion. The large side diffusion of the source junction results in a relatively large overlap between the source and the floating gate. Thus, the drawn gate length must be made large enough to account for such an overlap, which leads to a bigger cell size.

Figure 4A:
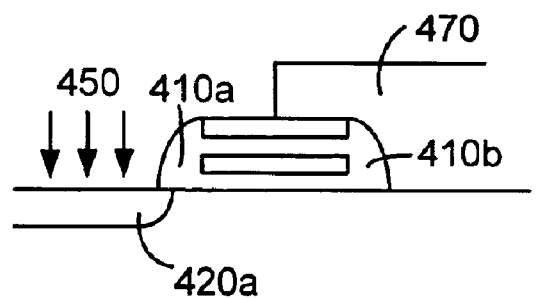
FIGS. 4a and 4b show cross section views of a source-side erase non-volatile memory cell at different processing steps in accordance with another exemplary embodiment of the present invention.
Figure 4B:
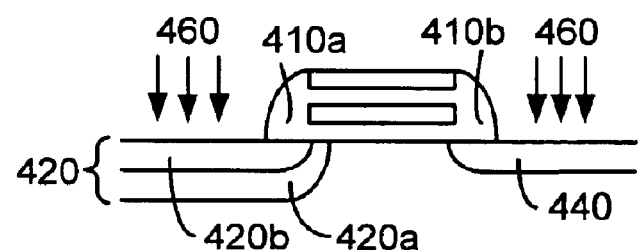

In one embodiment of the source-side erase cell approach shown in FIGS. 4a and 4b, after formation of the stacked gate, off-set spacers 410a, 410b are formed along the side-walls of the stacked gate. Next, using a masking layer 470, a source DDD implant 450 is carried out to form a source DDD region 420a. A conventional S/D implant 460 is then carried out, followed by thermal activation to form the source diffusion region 420b and drain diffusion region 440. In this manner, the overlap of each of source region 420 and drain region 440 with the floating gate is reduced by the thickness of the respective off-set spacers 410a, 410b, thus allowing the drawn cell gate length and the overall cell size to be reduced.

In another embodiment (not shown) of the FIG. 4 source-side erase cell approach, after the DDD implant 450 (FIG. 4a), main spacers are formed adjacent the off-set spacers 410a, 410b, followed by S/D implant 460 as shown in FIG. 4b. This embodiment has the added advantage that the main spacer can be used to adjust the distance between the outer edge of the DDD region 420a and the outer edge of the inner region 420b to improve source junction breakdown. Not that the S/D implant 460 may be split into two implanting steps whereby a first S/D implant optimized specifically to form the drain region 440 is carried out, and a second S/D implant optimized specifically to form the inner region 420b. Although this requires additional masking and processing steps, but it allows the source junction to be fully independently optimized for erase as well as other operations.

Figure 5A:
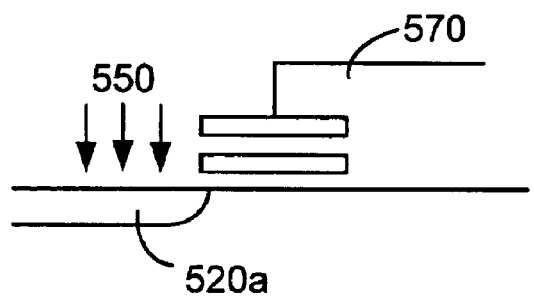
FIGS. 5a and 5b show cross section views of a source-side erase non-volatile memory cell at different processing steps in accordance with yet another exemplary embodiment of the present invention.
Figure 5B:
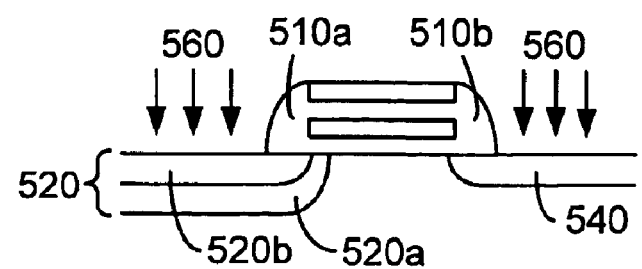

In another embodiment of the source-side erase cell approach shown in FIGS. 5a and 5b, off-set spacers 510a, 510b are formed after source DDD implant 550, but before the S/D implant 560. This sequence results in a wider separation between the outer edges of the two source regions 520a and 520b. The wider separation in turn results in a lower doping gradient, and thus an improved source junction breakdown and less band-to-band tunneling during cell erase operation. In this embodiment, since the source DDD region 520a is formed in the absence of an off-set spacer, the overlap between the source and the polysilicon stack is larger than the FIG. 4 embodiment, thus requiring a longer drawn channel length. The S/D implant may be split into a fist S/D implant for the drain region 540 and a separate second S/D implant for the inner region 520b. This provides more flexibility in forming the two source regions 520a, 520b, and allows the source and drain regions to be separately optimized.

Figure 6:
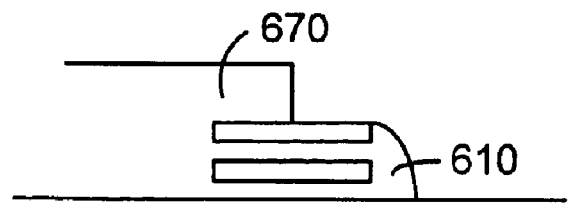
FIG. 6 shows a cross section view of a non-volatile memory cell at a processing step in accordance with another exemplary embodiment of the present invention.

In yet another embodiment shown in FIG. 6, by using a masking layer 670, only one off-set spacer 610 (either on the drain side or the source side) of the stacked gate can be formed, if desired.

Figure 7:
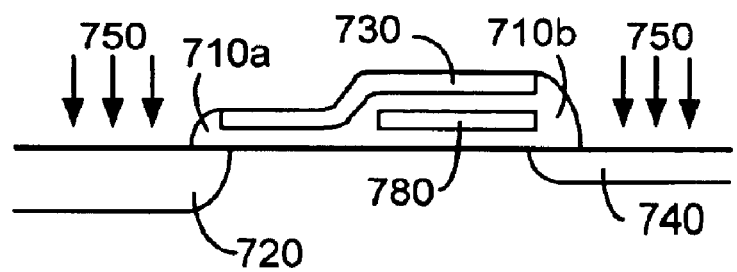
FIG. 7 shows a cross section view of a split-gate non-volatile memory cell at a processing step in accordance with another exemplary embodiment of the present invention.

The off-set spacer can also be advantageously used in split gate cell structures to reduce the drawn cell gate length, as shown in FIG. 7. Even though there is a height difference along the two side-walls of the split gate cell structure, the same off-set spacer deposition and etch steps will result in formation of off-set spacers 710a and 710b having similar thickness. As such, the extent of the overlap between the source 720 and the control gate 730 will be similar to that between the drain 740 and floating gate 780. Alternatively, by using a mask, as in the FIG. 5 embodiment, only one off-set spacer (either on the drain side or the source side) may by formed, as needed.

Next, FIGS. 3a–3d are used to illustrate how the off-set spacer is advantageously used in a process integrating non-volatile memory cell technology and CMOS process. Each of FIGS. 3a–3d shows cross section views of an array cell (the far left structure), a periphery DDD high voltage (HV) transistor (the middle structure) and a periphery LDD low voltage (LV) transistor (the far right structure). The three cross section views in each figure are intended to show how the array cell and periphery transistors are affected in a given process step.

FIG. 3a shows a polysilicon stack in the array cell, and polysilicon gates in the periphery HV DDD and LV LDD transistors, all formed in accordance with conventional processing techniques. Off-set spacers 310 are formed along the side-walls of the polysilicon stack in the array cell and the side-walls of the polysilicon gates of the periphery DDD and LDD transistors. After the off-set spacers formation, a DDD implant 350 is performed to form DDD junctions 320a, 340a for the HV DDD periphery transistor.

Next, as shown in FIG. 3b, after performing the required thermal cycles for the DDD regions 320a, 340a, a LDD implant 355 is performed to form LDD regions 325a, 327a for the LV LDD periphery transistor. Next, as shown in FIG. 3c, a source/drain (S/D) implant 317 is carried out for the array cell to form the cell source 328 and drain 329 regions.

Next, as shown in FIG. 3d, main oxide spacers 315 are formed adjacent the off-set spacers 310 for each of the array cell and the periphery DDD and LDD transistors. The main spacers in the cell are not necessary, and may be eliminated at the expense of a masking step if desired. A S/D implant 360 is then performed for the periphery DDD and LDD transistors to from highly doped regions 320b, 340b within the respective DDD regions 320a, 340a, and to from highly doped regions 325b, 327b within the respective LDD regions 325a, 327a. A conventional Boron Phosphorous Silicon Glass (BPSG) thermal cycle may then be carried out to activate all dopings.

In each of the steps depicted by FIGS. 3a–3d, a masking layer may be used to protect areas that are not to receive a given implant. For example, in FIG. 3b, a masking layer (not shown) may be used to protect the memory cell area and periphery DDD transistor area from receiving the LDD implant 355.

The process steps depicted in FIGS. 3a–3d result in formation of one type of memory cell and periphery DDD and LDD transistors depending on the impurities used in the implanting steps. NMOS (and/or PMOS) LDD and DDD transistors and a N-type (and/or P-type) memory cell are formed by using N-type (and/or P-type) impurities in the DDD, LDD and S/D implants. As an example, in FIG. 3b, NMOS LDD transistors are formed by implanting N⁻ impurities in the NMOS LDD transistor areas while a masking layer protects the cell area, the NMOS DDD transistor areas, the PMOS DDD transistor areas, and the PMOS LDD transistor areas. Similarly, PMOS LDD transistors can be formed by implanting P⁻ impurities in the PMOS LDD transistor areas while a masking layer covers the memory cell area, the NMOS DDD transistor area, the PMOS DDD transistor areas, and the NMOS LDD transistor area.

In an alternate embodiment of the process steps depicted in FIGS. 3a–3d, the S/D implant for the array cell and the periphery low and high voltage transistors is performed simultaneously. This reduces the number of masking steps by one, and eliminates the steps corresponding to the main spacer formation, but has the disadvantage of losing the flexibility of optimizing the S/D implant for the array and periphery areas independently. Also, eliminating the main spacers results in the LDD and DDD junctions being more closely spaced to their corresponding S/D junctions. This may result in lower junction breakdown voltage.

The process steps shown in FIGS. 3a–3d may be modified and/or their order changed depending on the process/device targets and goals. In one aspect of the invention, assuming that the off-set spacer formation step precedes the main spacer formation step, and the DDD and LDD implanting steps precede the S/D implant step, then at least seven different process step permutations are possible, as described next.

In a first exemplary permutation, off-set spacers are formed before the DDD implant, main spacers are formed for the cell and the periphery DDD and LDD transistors (or only for the DDD and LDD transistors) between the DDD implant and the subsequent LDD implant, and the S/D implant for the cell and the DDD and LDD transistors is performed (simultaneously or separately) after the LDD implant.

In a second exemplary permutation, off-set spacers are formed before DDD and LDD implant steps, and main spacers are formed for the cell and the DDD and LDD transistors (or only for the LDD and DDD transistors) after the DDD and LDD implant steps but before the S/D implant for the cell and the periphery transistors. The S/D implant may be performed simultaneously or separately for the cell and periphery transistors.

A third exemplary permutation corresponds to the process steps shown in FIGS. 3a–3d.

In a fourth exemplary permutation, off-set spacers are formed between the DDD implant and the subsequent LDD implant, and main spacers are formed for the cell and the DDD and LDD transistors (or only for the LDD transistor) between the LDD implant and the subsequent S/D implant for the cell and the periphery transistors. As in previous permutations, the S/D implant may be performed simultaneously or separately for the cell and periphery transistors.

In a fifth exemplary permutation, off-set spacers are formed between the DDD implant and the subsequent LDD and cell S/D implant, and main spacers are formed for the cell and the DDD and LDD transistors (or only for the LDD transistor) after LDD and cell S/D implant but before the periphery S/D implant.

In a sixth exemplary permutation, off-set spacers are formed after the DDD and LDD implant steps but before the cell S/D implant, and main spacers are formed for the cell and the DDD and LDD transistors (or eliminated all together) after the cell S/D implant but before the periphery S/D implant.

In a seventh exemplary permutation, off-set spacers are formed after the DDD and LDD implant steps but before the S/D implant for the cell and periphery transistors, and the S/D implant for the cell and periphery DDD and LDD transistors are performed simultaneously after the off-set spacer formation.

Process step permutations, other than those describe above, can also be envisioned by one skilled in the art in light of the description provided herein. For example, in the above process permutations, the off-set spacers for the cell and the LDD and DD transistors are formed at the same time. If specific requirements for the transistors warrant it, the off-set spacers can be formed separately for each of the array cells, LDD transistors, and DDD transistors. However, each additional off-set spacer requires a separate set of processing and potentially masking steps, e.g., spacer oxide deposition, a masking step to expose only the cell area or the DDD or LDD transistor areas, and a spacer etch, thus increasing the process cost.

Although the CMOS portion of the integrated process described above includes DDD and LDD transistors, modifying this process to eliminate one or both of the LDD and DDD type transistors, or to include other types of MOS transistors, would be readily apparent to one skilled in the art in light of the description provided herein.

Similarly, although the cell portion of the integrated process described above corresponds to a symmetrical stack gate cell, modifying the process to implement other types of memory cells would be obvious to one skilled in the art in light of the description provided herein. For example, in the case of the asymmetrical source-side erase cell which has a DDD source region, the steps corresponding to FIG. 3a can be modified so that the DDD implant 350 is also provided for the cell to form the DDD source region of the cell. Alternatively, to enable independent optimization of the cell and the periphery DDD transistor, a cell DDD implant, independent of the periphery DDD implant, can be added to the process steps at the expense of additional masking and processing steps. The other process permutations and variations described above can be similarly modified to enable implementation of a source-side erase cell or other types of cells.

In the above-described process and device structure embodiments and their variations, the off-set-spacer may have been referred to as an oxide spacer, however, the invention is not limited as such. The off-set spacer may instead be oxynitride (i.e., oxide containing certain amount of nitrogen), or a composite oxide-nitride, or a composite oxide-nitride-oxide. In one embodiment, an off-set oxide-nitride spacer is formed by first forming a high temperature oxide (HTO) layer having a thickness in the range of 20–100 Å, followed by forming a nitride layer having a thickness in the range of 100–500 Å over the HTO layer, in accordance with conventional techniques. In a subsequent step, both the oxide and nitride layers are etched to form oxide-nitride off-set spacers, or alternatively, only the nitride layer is etched to form nitride spacers adjacent the oxide layer along the side-walls of the memory cell and/or periphery transistors, such that the subsequent S/D implant is carried out through the oxide layer. In the latter case, to obtain the proper junction characteristics, the S/D implant energy and dose need to be properly adjusted based on the combined thickness of the off-set oxide layer and any screening (residual) oxide layer(s) present from prior processing steps.

For memory cells, the advantage of an off-set oxide-nitride spacer is that the oxide layer ensures better charge retention characteristics while the nitride layer serves as a natural spacer and polysilicon gate stack protector from subsequent etch steps such as self-aligned contact (SAC) etch.

In the different embodiments described above, many types of impurities are available for the different implant steps. As an example, in forming NMOS transistors and N-type memory cells, the N– impurities used during the LDD and DDD implants may be phosphorous, and the N+ implant used during the S/D implant may be arsenic; and in forming PMOS transistors and P-type memory cells, the P– impurities used during the LDD and DDD implants may be boron, and the P+ impurities used during the S/D implant may be the heavier boron atom $BF_2$.

In the figures, the highly doped inner region of the LDD and DDD regions is shown not to overlap the gate electrode or the floating gate, however, the invention is not limited as such. Depending on the thicknesses of the off-set and main spacers and the thermal cycle(s) following the implant step(s), the inner regions may or may not overlap the gate electrode or the floating gate.

The above-mentioned inverse relationship between the amount of overlap (e.g., between gate and S/D) and the off-set spacer thickness may or may not be linear depending on the process parameters and targets. Similarly, the above-mentioned distance between the outer edge of each of the LDD and DDD regions and the outer edge of their corresponding inner region may or may not be linearly dependent on the thickness of the off-set or main spacers.

In accordance with the present invention, a means for dramatic scaling of the channel length is provided such that high performance MOS transistors and memory cell structures with extremely small gate feature and overall size that exhibit robust program/erase efficiency and read speed, and enable low operating voltages, can be manufactured.

The above description is illustrative and not restrictive. For example, the above process parameters, such as the indicated thicknesses, doping concentrations and energies are merely illustrative. The scope of the invention should, therefore, be determined not with reference to the above description, but instead should be determined with reference to the appended claims along with their full scope of equivalents.

What is claimed is:

1. A method of forming semiconductor transistors, comprising:

forming a gate electrode over but insulated from a semiconductor body region for each of first and second transistors;

forming off-set spacers along side-walls of the gate electrode of each of the first and second transistors;

after forming said off-set spacers, performing a DDD implant to form DDD source and DDD drain regions in the body region for the first transistor;

after said DDD implant, forming main spacers adjacent the off-set spacers of at least the first transistor;

performing a LDD implant to form LDD source and LDD drain regions for the second transistor; and after forming the main spacers, performing a source/drain (S/D) implant to form a highly doped region within each of the DDD drain and DDD source regions and each of the LDD drain and LDD source regions, the highly doped regions being of the same conductivity type as and having a doping concentration greater than the DDD and LDD regions.

2. The method of claim 1 wherein, the extent of an overlap between the gate electrode of the first transistor and each of the DDD source and DDD drain regions is inversely dependent on a thickness of the off-set spacers, and a distance between an outer edge of each of the DDD source and DDD drain regions and an outer edge of the corresponding highly doped region within each of the DDD source and DDD drain regions is directly dependent on a thickness of the main spacers.

* * * * *